(12) United States Patent
Cha et al.

(10) Patent No.: US 10,312,382 B2
(45) Date of Patent: Jun. 4, 2019

(54) QUENCHING CIRCUIT

(71) Applicant: Hongik University Industry-Academia Cooperation Foundation, Seoul (KR)

(72) Inventors: Ho Young Cha, Seoul (KR); Jongik Kang, Seoul (KR)

(73) Assignee: Hongik University Industry-Academia Cooperation Foundation, Seoul (KR)

( * ) Notice: Subject to any disclaimer, the term of this patent is extended or adjusted under 35 U.S.C. 154(b) by 0 days.

(21) Appl. No.: 15/927,350

(22) Filed: Mar. 21, 2018

(65) Prior Publication Data

US 2018/0277689 A1    Sep. 27, 2018

(30) Foreign Application Priority Data

Mar. 22, 2017 (KR) .......................... 10-2017-0036090

(51) Int. Cl.
| | |
|---|---|
| *H01L 31/107* | (2006.01) |
| *H01L 31/02* | (2006.01) |
| *H01L 31/0216* | (2014.01) |
| *H01L 31/0304* | (2006.01) |
| *H01L 31/0312* | (2006.01) |

(52) U.S. Cl.
CPC .. *H01L 31/02027* (2013.01); *H01L 31/02164* (2013.01); *H01L 31/0312* (2013.01); *H01L 31/03044* (2013.01); *H01L 31/107* (2013.01); *Y02E 10/50* (2013.01)

(58) Field of Classification Search
CPC ..... H01L 31/02027; H01L 2924/12031; H01L 2924/12043; H01L 29/868; H01L 29/66113; H01L 29/66143; H01L 31/107
See application file for complete search history.

(56) References Cited

U.S. PATENT DOCUMENTS

| | | | |
|---|---|---|---|
| 8,502,234 B2* | 8/2013 | Kizilyalli | ............ H01L 29/8083 257/192 |
| 9,184,190 B2 | 11/2015 | Sato et al. | |
| 2010/0127314 A1 | 5/2010 | Frach | |

FOREIGN PATENT DOCUMENTS

| | | |
|---|---|---|
| KR | 10-0155312 B1 | 2/1999 |
| KR | 10-0170191 B1 | 3/1999 |
| KR | 10-2010-010808 A | 11/2010 |

* cited by examiner

*Primary Examiner* — Hsien Ming Lee
(74) *Attorney, Agent, or Firm* — Westman, Champlin & Koehler, P.A.; Amanda M. Prose

(57) ABSTRACT

Disclosed is a quenching circuit including an avalanche photodiode and a quenching diode applying a bias voltage to the avalanche photodiode. Since the quenching circuit includes the quenching diode instead of a quenching resistor, the avalanche photodiode can quickly recover to linear mode from Geiger mode, and the bias voltage applied to the avalanche photodiode is stably maintained even though a current level of the avalanche photodiode fluctuates according to the intensity of incident light.

12 Claims, 10 Drawing Sheets

QUENCHING CIRCUIT

CROSS REFERENCE TO RELATED APPLICATION

The present application claims priority to Korean Patent Application No. 10-2017-0036090, filed Mar. 22, 2017, the entire contents of which is incorporated herein for all purposes by this reference.

BACKGROUND OF THE INVENTION

Field of the Invention

The present invention relates generally to a quenching circuit. More particularly, the present invention relates to a quenching circuit capable of maintaining a stable quenching voltage for recovery to a linear mode operation even with a changing current flowing through an avalanche photodiode according to input photons when the avalanche photodiode operates in Geiger mode to detect photons.

Description of the Related Art

An avalanche photodetector (APD) is a photo sensitive device (also called a photon detector) that converts light energy into electrical energy and has a high gain due to a photon multiplication effect. Avalanche photodiodes are used in optical sensors that find their application in quantum communication systems, three-dimensional light detection and ranging (LIDAR) systems, etc.

An avalanche photodiode provides a relatively low gain at a reverse bias voltage lower than a breakdown voltage thereof. Meanwhile, the avalanche photodiode exhibits a linear relationship between a photoelectric current and an incident light level at a reverse bias voltage lower than the breakdown voltage thereof. However, in Geiger mode in which a reverse bias voltage is above a breakdown voltage, an avalanche photodiode experiences an avalanche breakdown that is a phenomenon wherein pairs of charge carriers are generated by photo excitation and the number of charge carriers increases exponentially due to impact ionization occurring in the consequence of carrier acceleration caused by an increased electric field strength, which results in charge carriers stored in the diode suddenly flowing, resulting in a net current that abruptly and rapidly surges. Due to this phenomenon, a higher current-to-photon gain than that in linear mode can be obtained. Consequently, detection of even single photons becomes possible.

The advantage of operation in Geiger mode is that such highly sensitive detection of a single photon level is practically possible even with a relatively simple device structure. Meanwhile, the disadvantage of operation in Geiger mode is that when a large current continuously flows through the diode after the breakdown, the diode may be damaged. For this reason, the diode needs to recover from the breakdown in a short time to avoid the damage thereto. Returning the avalanche photodiode from the Geiger mode operation to the linear mode operation is called quenching. To this end, a passive quenching scheme in which a quenching resistor is connected in series with an avalanche photodiode is usually used. When a current surges due to the electrical breakdown, the quenching resistor develops an ohmic voltage drop while the current flows through the quenching resistor, thereby enabling the avalanche photodiode to restore from the Geiger mode to the linear mode in which the reverse bias voltage applied across the avalanche photodiode is below the breakdown voltage, whereby protecting the avalanche photodiode.

Conventional quenching circuits have a disadvantage of requiring a high load resistor to provide a sufficient voltage drop therethrough because a current flowing through an avalanche photodiode is small. For example, when a photoelectric current flowing through an avalanche photodiode is 1 µA, a quenching circuit needs to have a 5 MΩ resistor for quenching the avalanche current of 5V. Such a high load resistor poses a problem of increasing an RC time constant, resulting in an increase in an RC delay time.

Moreover, conventional passive quenching schemes have a problem that a bias voltage (=R×I) is not constant but linearly changes with a photoelectric current. That is, when a photoelectric current changes according to the amount of incident photons, the voltage also changes linearly. Accordingly, it was difficult to obtain a stable quenching performance with a conventional passive quenching scheme using a quenching resistor.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent Application Publication No. 2010-0120808

SUMMARY OF THE INVENTION

Accordingly, the present invention has been made keeping in mind the above problems occurring in the related art, and an object of the present invention is to provide a quenching circuit using a diode as a quenching element rather than a resistor. Since the quenching circuit uses a quenching diode as a quenching element instead of a quenching resistor, the quenching circuit has advantages that an avalanche photodiode connected in series to the quenching element can rapidly switch to linear mode from Geiger mode and a bias voltage applied to the avalanche photodiode can be maintained to be stable and almost constant although a current level in the avalanche photodiode greatly fluctuates according to input photons.

In order to accomplish the above object, according to one aspect of the invention, there is provided a quenching circuit composed of an avalanche photodiode and a quenching diode providing a bias voltage to a terminal of the avalanche photodiode, the quenching circuit including: a first p-type semiconductor layer; a first i-type semiconductor layer provided on an upper surface of the first p-type semiconductor layer; a first n-type semiconductor layer provided on an upper surface of the first i-type semiconductor layer; a second i-type semiconductor layer provided on a portion of the upper surface of the first n-type semiconductor layer; a second p-type semiconductor layer provided on an upper surface of the second i-type semiconductor layer; and a pair of metal electrode respectively serving as a first electrode provided under a lower surface of the first p-type semiconductor layer and a second electrode provided on an upper surface of the second p-type semiconductor layer, wherein the avalanche photodiode is a PIN diode including the first p-type semiconductor layer, the first i-type semiconductor layer, and the first n-type semiconductor layer, and having a light-receiving region defined as a portion of the upper surface of the first n-type semiconductor layer, the portion not being covered by the second i-type semiconductor layer, and wherein the quenching diode is a PIN diode including the second p-type semiconductor layer, the second i-type semiconductor layer and the first n-type semiconductor layer.

Each of the first p-type semiconductor layer, the first i-type semiconductor layer, the first n-type semiconductor layer, the second p-type semiconductor layer, and the second i-type semiconductor layer may be an SiC-based semiconductor layer.

Each of the first p-type semiconductor layer, the first i-type semiconductor layer, the first n-type semiconductor layer, the second p-type semiconductor layer, and the second i-type semiconductor layer may be a GaN-based semiconductor layer.

The quenching circuit may further include: a passivation layer made of an insulating material and formed to have an opening through which at least part of each of the metal electrodes is exposed; and a metal masking layer being provided on the second electrode and the passivation layer, formed within a region excluding the light-receiving region, formed not to be in contact with the first electrode, and functioning to block incident light.

According to another aspect of the invention, there is provided a quenching circuit composed of an avalanche photodiode and a quenching diode providing a bias voltage to one terminal of the avalanche photodiode, the quenching circuit including: a first p-type semiconductor layer; a first i-type semiconductor layer provided on an upper surface of the first p-type semiconductor layer; a first n-type semiconductor layer provided on an upper surface of the first i-type semiconductor layer; a second p-type semiconductor layer provided on a portion of an upper surface of the first n-type semiconductor layer; and a pair of metal electrodes respectively serving as a first electrode provided under a lower surface of the first p-type semiconductor layer and a second electrode provided on an upper surface of the second p-type semiconductor layer, wherein the avalanche photodiode is a PIN diode including the first p-type semiconductor layer, the first i-type semiconductor layer, and the first n-type semiconductor layer, and having a light-receiving region defined as a portion of the upper surface of the first n-type semiconductor layer, the portion being not covered by the second p-type semiconductor layer, and wherein the quenching diode is a PN diode including the second p-type semiconductor layer and the first n-type semiconductor layer.

Each of the first p-type semiconductor layer, the first i-type semiconductor layer, the first n-type semiconductor layer, and the second p-type semiconductor layer may be an SiC-based semiconductor layer.

Each of the first p-type semiconductor layer, the first i-type semiconductor layer, the first n-type semiconductor layer, and the second p-type semiconductor layer may be a GaN-based semiconductor layer.

The quenching circuit may further include: a passivation layer made of an insulating material and formed to have an opening through which at least part of the metal electrode is exposed; and a metal masking layer provided on the second electrode and the passivation layer, formed within a region excluding the light-receiving region, formed not to be in contact with the first electrode, and functioning to block incident light.

According to a further aspect of the invention, there is provided a quenching circuit composed of an avalanche photodiode and a quenching diode providing a voltage to one terminal of the avalanche photodiode, the quenching circuit including: a first p-type semiconductor layer; a first i-type semiconductor layer provided on an upper surface of the a first p-type semiconductor layer; a first n-type semiconductor layer provided on an upper surface of the first i-type semiconductor layer; a second $n^-$-type semiconductor layer provided on a portion of an upper surface of the first n-type semiconductor layer; a Schottky metal layer provided on an upper surface of the second $n^-$-type semiconductor layer; and a pair of metal electrodes respectively serving as a first electrode provided under a lower surface of the a first p-type semiconductor layer and a second electrode provided on an upper surface of the Schottky metal layer, wherein the avalanche photodiode is a PIN diode including the first p-type semiconductor layer, the first i-type semiconductor layer, and the first n-type semiconductor layer, and having a light-receiving region defined as a portion of the upper surface of the first n-type semiconductor layer, the portion being not provided with the second $n^-$-type semiconductor layer, and wherein the quenching diode is a Schottky diode including the Schottky metal layer, the second $n^-$-type semiconductor layer, and the first n-type semiconductor layer.

Each of the first p-type semiconductor layer, the first i-type semiconductor layer, the first n-type semiconductor layer, and the second $n^-$-type semiconductor layer may be an SiC-based semiconductor layer.

Each of the first p-type semiconductor layer, the first i-type semiconductor layer, the first n-type semiconductor layer, and the second $n^-$-type semiconductor layer may be a GaN-based semiconductor layer.

The quenching circuit may further include: a passivation layer made of an insulating material and formed to have an opening through which at least part of the metal electrode is exposed; and a metal masking layer provided on the second electrode and the passivation layer, formed within a region excluding the light-receiving region, formed not to be in contact with the first electrode, and functioning to block incident light.

The Schottky metal layer may be made of any one of nickel (Ni), titanium (Ti), aluminum (Al), and tungsten (W).

According to a further aspect of the invention, there is provided a quenching circuit composed of an avalanche photodiode and a quenching diode providing a bias voltage to one terminal of the avalanche photodiode, the quenching circuit including: a first n-type semiconductor layer; a first i-type semiconductor layer provided on an upper surface of the first n-type semiconductor layer and provided with a first hole through which a portion of the first n-type semiconductor layer is exposed; a first p-type semiconductor layer provided on an upper surface of the first i-type semiconductor layer and provided with a second hole extending perpendicularly from the first hole; and a pair of metal electrodes respectively serving as a first electrode and a second electrode, the first electrode being provided on the first p-type semiconductor layer divided into a first region and a second region by the second hole, the first electrode being provided on the first region of the upper surface of the first p-type semiconductor layer, the second electrode provided on the second region of the upper surface of the first p-type semiconductor layer, wherein the avalanche photodiode is a PIN diode including the first region of the first p-type semiconductor layer, a first region of the first i-type semiconductor layer that is divided into the first region and a second region by the first hole, and the first n-type semiconductor layer, having a light-receiving region defined as the first region of the upper surface of the first p-type semiconductor layer, and wherein the quenching diode is a PIN diode including the second region of the first p-type semiconductor layer, the second region of the first i-type semiconductor layer, and the first n-type semiconductor layer.

Each of the first n-type semiconductor layer, the first i-type semiconductor layer, and the first p-type semiconductor layer may be an SiC-based semiconductor layer.

Each of the first n-type semiconductor layer, the first i-type semiconductor layer, and the first p-type semiconductor layer may be a GaN-based semiconductor layer.

The quenching circuit may further include: a passivation layer made of an insulating material and formed to have an opening through which at least part of the metal electrode is exposed; and a metal masking layer provided on the second electrode and the passivation layer, formed within a region excluding the light-receiving region, formed not to be in contact with the first electrode, and functioning to block incident light.

According to a further aspect of the invention, there is provided a quenching circuit composed of an avalanche photodiode and a quenching diode providing a bias voltage to one terminal of the avalanche photodiode, the quenching circuit including a first n-type semiconductor layer; a first p-type semiconductor layer provided on an upper surface of the first n-type semiconductor layer and provided with a first hole through which a portion of the first n-type semiconductor layer is exposed; and a pair of metal electrodes respectively serving as a first electrode and a second electrode, the first electrode provided on a first region of the upper surface of the first p-type semiconductor layer divided into the first region and a second region by the first hole, the second electrode provided on the second region of the upper surface of the first p-type semiconductor layer, wherein the avalanche photodiode is a PN diode including the first region of the first p-type semiconductor layer and the first n-type semiconductor layer, and having a light-receiving region defined as the first region of the upper surface of the first p-type semiconductor layer, and wherein the quenching diode is a PN diode including the second region of the first p-type semiconductor layer and the first n-type semiconductor layer.

Each of the first n-type semiconductor layer and the first p-type semiconductor layer may be an SiC-based semiconductor layer.

Each of the first n-type semiconductor layer and the first p-type semiconductor layer is a GaN-based semiconductor layer.

The quenching circuit may further include a passivation layer made of an insulating material and formed to have an opening through which at least part of the metal electrode is exposed; and a metal masking layer provided on the second electrode and the passivation layer, formed within a region excluding the light-receiving region, formed not to be in contact with the first electrode, and functioning to block incident light.

As described above, the quenching circuit according to the present invention uses a PIN diode, a PN diode, or a Schottky diode as a quenching element rather than using a quenching resistor, thereby reducing an RC time delay and whereby quenching the breakdown state in a short time.

Moreover, even with a current change in the avalanche photodiode according to input photons, a quenching voltage may not linearly change but may remain almost constant.

Moreover, when the quenching diode is implemented as a PIN, the quenching voltage may be controlled by adjusting the thickness of the i-type semiconductor layer of the PIN diode.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1A:
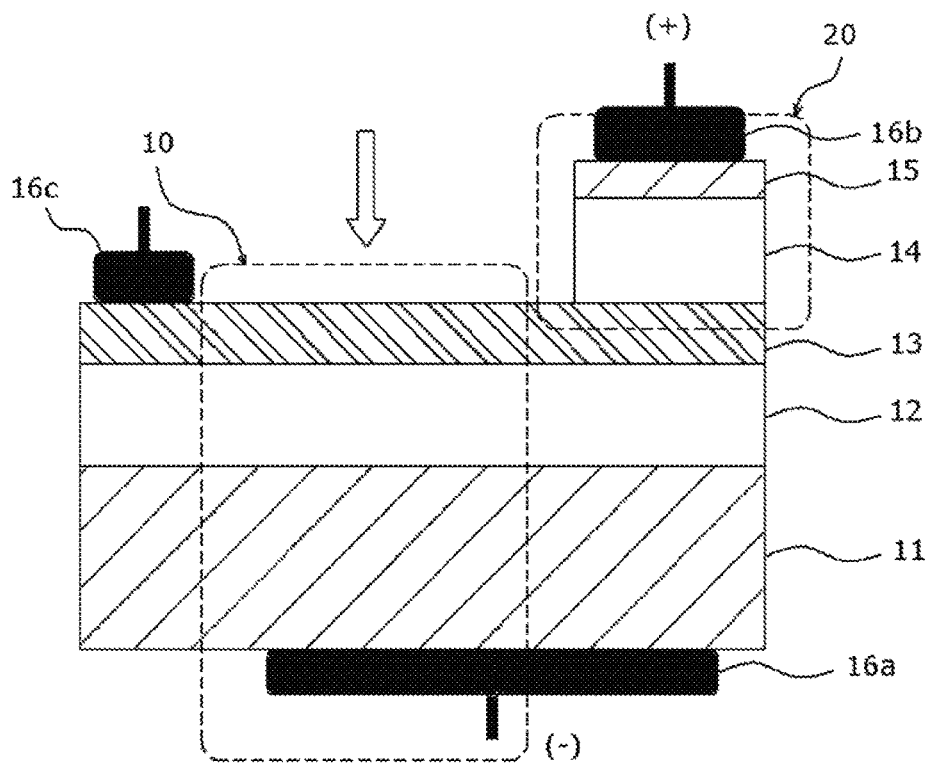
FIGS. 1A and 1B are respectively a cross-sectional view and a circuitry diagram illustrating a schematic construction of an avalanche photodiode and a quenching diode of a quenching circuit according to a first embodiment of the present invention.

The description of the disclosed technology is merely an example for structural or functional aspects of the present invention, and thus the protection scope of the disclosed technology should not be construed as being limited by the embodiments described in the present specification. That is, those skilled in the art will appreciate that the embodiments may be modified, changed, or altered in various ways and can be embodied in various forms. Therefore, the claimed scope of the disclosed technology should be understood to include equivalents capable of substantially realizing technical ideas of the present invention.

The terminology used herein is for the purpose of describing particular embodiments only and is not intended to be limiting. The terminology should be interpreted in ways described below.

It will be understood that, although the terms first, second, etc. may be used herein to describe various elements, these elements should not be limited by these terms. These terms are only used to distinguish one element, from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Further, the terms used herein to describe a relationship between elements, for example, "between", "directly between", "adjacent", or "directly adjacent" should be interpreted in the same manner as those described above.

It will be further understood that when a component "comprises" or "has" another component, it means that the component may further include another component, not excluding another component unless stated otherwise.

As used herein, the singular forms "a," "an" and "the" are intended to include the plural forms as well, unless the context clearly indicates otherwise. It will be further understood that the terms "comprise", "include", "have", etc. when used in the present disclosure specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1B:
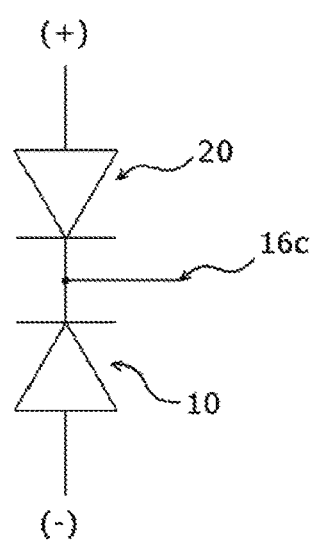

FIGS. 1A and 1B are respectively a cross-sectional view and a circuitry diagram of an avalanche photodiode and a quenching diode of a quenching circuit according to a first embodiment of the present invention.

As illustrated in FIG. 1A, the quenching circuit according to the first embodiment of the present invention includes a first p-type semiconductor layer 11, a first i-type semiconductor layer 12 provided on an upper surface of the first p-type semiconductor layer 11, a first n-type semiconductor layer 13 provided on an upper surface of the first i-type semiconductor layer 12, a second i-type semiconductor layer 14 provided on a portion of an upper surface of the first n-type semiconductor layer 13, a second p-type semiconductor layer 15 provided on an upper surface of the second i-type semiconductor layer 14, and a pair of metal electrodes 16a and 16b respectively serving as a first electrode and a second electrode. The first electrode 16a is provided under a lower surface of the first p-type semiconductor layer 11 and the second electrode 16b is provided on an upper surface of the second p-type semiconductor layer 15. A third electrode 16c is a terminal used to detect a voltage change caused by the quenching diode 20 when a photoelectric current occurs in an avalanche photodiode 10. The third electrode 16c is disposed to output a voltage between the cathode of the avalanche photodiode 10 and the cathode of the quenching diode 20 therethrough.

The avalanche photodiode 10 has a PIN photodiode structure composed of the first p-type semiconductor layer 11, the first i-type semiconductor layer 12, and the first n-type semiconductor layer 13. The first electrode 16a functions as the anode of the avalanche photodiode 10. The avalanche photodiode 10 having a PIN photodiode structure has advantages of a high response speed and a good photoelectric conversion efficiency because electron-hole pairs are generated in an I layer (depletion layer) in which a high electric field exists.

The avalanche photodiode 10 receives photons (light) through a light-receiving region thereof, which is a region where the quenching diode 20 is not formed. The light-receiving region is provided within a portion of the upper surface of the first n-type semiconductor layer 13, the portion being a region where the second i-type semiconductor layer 14 is not provided. To secure the light-receiving region having a sufficient size, it is preferable to minimize the sizes of the second i-type semiconductor layer 14 and the second p-type semiconductor layer 15 while securing the quenching performance of the quenching diode 20.

The quenching diode 20 has a PIN diode structure composed of the second p-type semiconductor layer 15, the second i-type semiconductor layer 14, and the first n-type semiconductor layer 13.

As illustrated in FIGS. 1A and 1B, when a lower voltage (−) is applied to the first electrode 16a and a higher voltage (+) is applied to the second electrode 16b, the avalanche photodiode 10a composed of the first p-type semiconductor layer 11, the first i-type semiconductor layer 12, and the first n-type semiconductor layer 13 is reverse-biased, and the quenching diode 20 composed of the second p-type semiconductor layer 15, the second i-type semiconductor layer 14, and the first n-type semiconductor layer 13 is forward-biased.

Hereinbelow, referring to FIG. 2, the principles of operation of the quenching circuit according the first embodiment of the present invention will be described in detail.

Figure 2:
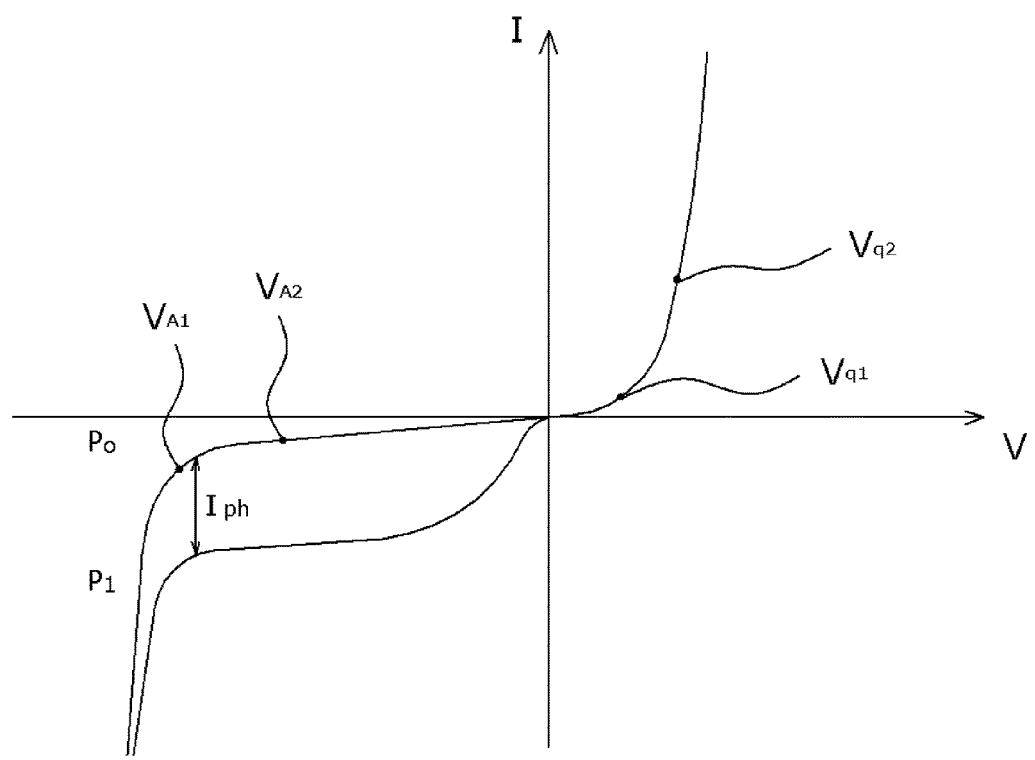
FIG. 2 is a graphical representation illustrating current-voltage characteristics (I-V curves) of the avalanche photodiode and the quenching diode of the quenching circuit according to the first embodiment of the present invention.

FIG. 2 is a graphical representation illustrating current-voltage characteristics (I-V curves) of the quenching diode and the avalanche photodiode of the quenching circuit according to the first embodiment of the present invention.

The value of the voltage applied between the first electrode 16a and the second electrode 16b may be determined such that the avalanche photodiode 10 is sufficiently reverse-biased to have a high gain. When the intensity of light incident onto the avalanche photodiode 10 is P0, only a dark current flows through the avalanche photodiode 10. In this state, a voltage of VA1 is applied to the avalanche photodiode 10. The light intensity P0 is the intensity of light in a state in which there is no incident light. In this state, the quenching diode 20 is forward-biased, so that a weak current corresponding to the dark current flowing through the avalanche photodiode 10 flows through the quenching diode 20 whereby a very low voltage of Vq1 is detected across the quenching diode 20. Reference symbol Vq1 means a voltage applied to the quenching diode 20 when there is no light incident onto the avalanche photodiode.

When light is incident onto the avalanche photodiode 10, that is, when the intensity of light becomes P1, a photoelectric current (the sum of the dark current and Iph) flows through the avalanche photodiode 10, and a current corresponding to the photoelectric current accordingly flows through the quenching diode 20 that is forward-biased. When the current flowing through the quenching diode 20 increases to the extent that a voltage applied to the quenching diode 20 is equal to or higher than a threshold voltage of the quenching diode 20, the quenching diode 20 is turned on. At this point, a forward-bias turn-on voltage Vq2 of the quenching diode 20 serves as a quenching voltage, so that the voltage across the avalanche photodiode 10 starts decreasing to reach a predetermined voltage level, i.e., VA2. In this way, the avalanche photodiode 10 switches from the Geiger mode to the linear mode in which a reverse-bias voltage below the avalanche breakdown voltage is applied to the avalanche photodiode 10, due to the action of the quenching voltage.

According to the first embodiment of the present invention, since the quenching voltage is the forward-bias turn-on voltage of the quenching diode, the quenching voltage may be stably maintained even though the current flowing through the avalanche photodiode fluctuates in a range above a predetermined current level. Furthermore, since the avalanche photodiode 10 and the quenching diode 20 have a relatively simple layered structure, they can be easily manufactured as discrete devices or easily implemented into a packaged device or a circuit.

With respect to the quenching diode 20, the quenching voltage can be controlled through the thickness adjustment of the I layer (i.e., the second i-type semiconductor layer 14) thereof during manufacturing of the quenching diode. As the thickness of the I layer (i.e., the second i-type semiconductor layer 14) is increased, the forward-bias turn-on voltage of the quenching diode having the PIN diode structure increases, which results in an increase in the quenching voltage.

Figure 8A:
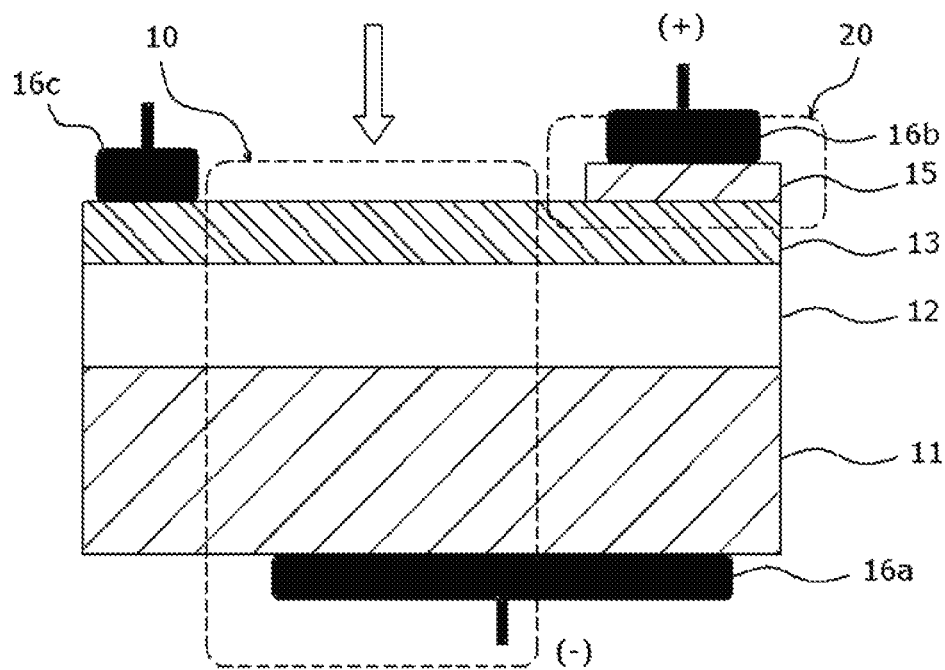
FIGS. 8A and 8B are respectively a cross-sectional view and a circuitry diagram illustrating a schematic construction of an avalanche photodiode and a quenching diode of a quenching circuit according to a modification of the first embodiment of the present invention.
Figure 8B:
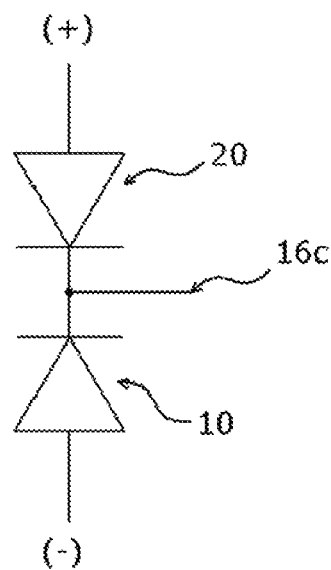

In the case where the quenching circuit is designed not to require a high quenching voltage, the quenching diode 20 of FIG. 1 may be implemented as a PN diode as illustrated in FIG. 8. That is, the second p-type semiconductor layer 15 is provided only on a portion of the upper surface of the first n-type semiconductor layer 13 shown in FIG. 1, and the quenching diode 20 has a PN diode structure composed of the second p-type semiconductor layer and the first n-type semiconductor layer 13. In addition, among regions within the upper surface of the first n-type semiconductor layer 13, a region where the second p-type semiconductor layer is not disposed is defined as the light-receiving region of the avalanche photodiode 10. In the quenching diode implemented as a PN diode, a depletion layer is formed at the P-N junction thereof, and the size (thickness) of the depletion layer is controlled through adjustment of a doping concentration of each semiconductor layer so that the quenching voltage can be controlled.

Figure 9A:
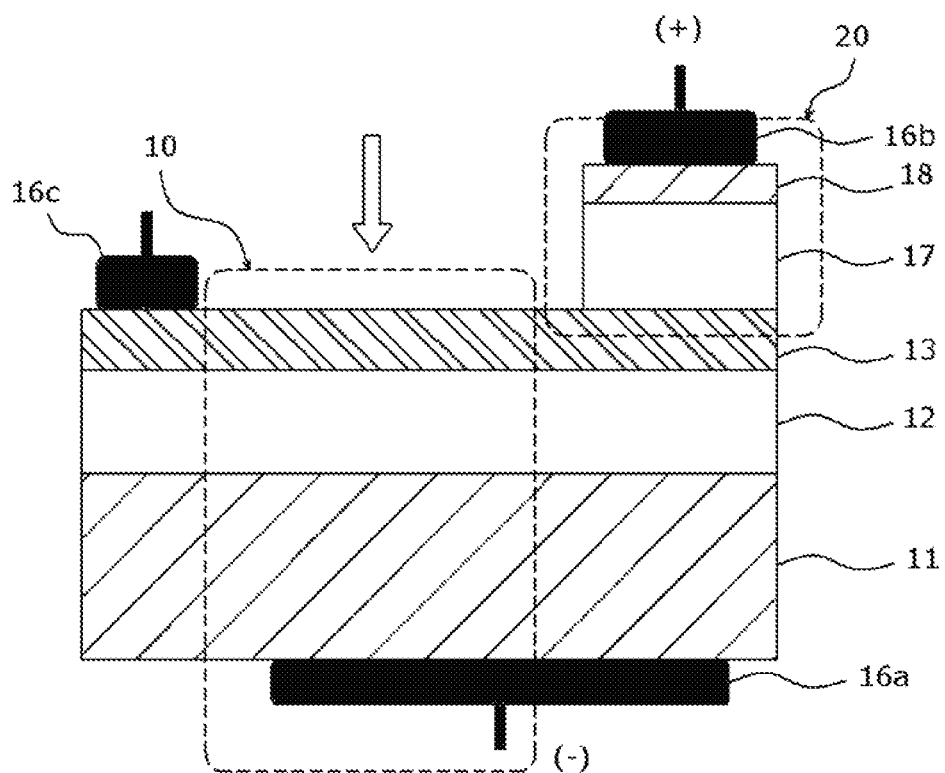
FIGS. 9A and 9B are respectively a cross-sectional view and a circuitry diagram illustrating a schematic construction of an avalanche photodiode and a quenching diode of a quenching circuit according to another modification of the first embodiment of the present invention.
Figure 9B:
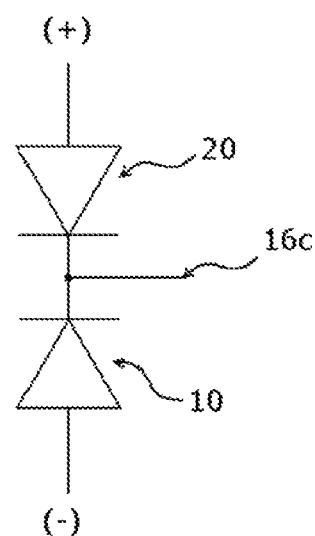

The quenching diode 20 of FIG. 1 may be implemented as a Schottky diode as illustrated in FIG. 9. Typically, a Schottky diode has a smaller capacitance than a PN diode, thereby having an advantage of operating at a higher speed. The Schottky diode is constructed such that a second n⁻-type semiconductor layer 17 is disposed on a portion of the upper surface of the first n-type semiconductor layer 13 and a Schottky metal layer 18 made of any one of nickel (Ni), titanium (Ti), Aluminum (Al), and tungsten (W) is provided on an upper surface of the second n⁻-type semiconductor layer 17. Among regions formed in the upper surface of the first n-type semiconductor layer 13, a region where the second n⁻-type semiconductor layer is not disposed is defined as the light-receiving region of the avalanche photodiode 10. When it is necessary to further increase the quenching voltage which is provided by the Schottky diode, a plurality of Schottky diodes may be formed on the first n-type semiconductor layer 13 and connected to each other.

The first p-type semiconductor layer 11, the first i-type semiconductor layer 12, the first n-type semiconductor layer 13, the second i-type semiconductor layer 14, and the second p-type semiconductor layer 15 may be provided as an epitaxial laminate structure on a wafer.

That is, the avalanche photodiode 10 having a PIN diode structure may be manufactured by forming the first i-type semiconductor layer 12 on the first n-type semiconductor layer 13 and forming the first p-type semiconductor layer 11 on the i-type semiconductor layer 12. However, the method of forming the avalanche photodiode 10 may not be limited thereto.

Next, one surface of the wafer undergoes etching such that a first surface (upper surface in the figure) of the first n-type semiconductor layer 13, which is opposite to a second surface (lower surface in the figure) on which the first i-type semiconductor layer 12 is provided, is exposed, the second i-type semiconductor layer 14 is formed on the etched first n-type semiconductor layer 13, and the second p-type semiconductor layer 15 is then formed on the second i-type semiconductor layer 14. In this way, the quenching diode 20 having a PIN diode structure is manufactured. However, the method of forming the quenching diode 20 may not be limited thereto.

The epitaxial laminate structure may be formed through epitaxial growth or ion implantation.

The first p-type semiconductor layer 11, the first i-type semiconductor layer 12, the first n-type semiconductor layer 13, the second i-type semiconductor layer 14, the second p-type semiconductor layer 15, and the second n⁻-type semiconductor layer may be respectively SiC-based or GaN-based semiconductor layers. However, the material may not be limited thereto and various materials including Si-based materials may be applied thereto. The SiC-based or GaN-based semiconductor layers may be prepared in a manner of being sequentially formed on a substrate or in a manner of being grown on substrates. In the case of growing the SiC-based or GaN-based semiconductor layers on separate substrates, the substrates are etched first for formation of conductive contacts to form electrodes.

Although not illustrated in the drawings, the remaining regions of the surface of the avalanche photodiode 10 except for the light-receiving region may be covered by a metal blocking layer or a metal masking layer thereon so that light cannot enter into the regions except for the light-receiving region. That is, in FIG. 1A, the upper surface of the remaining portion of the first n-type semiconductor layer 13 except for the exposed portion of the first n-type semiconductor layer may be provided with the metal blocking layer. The metal blocking layer prevents light from entering into the quenching diode 20 and allows light to enter only into the light-receiving region of the avalanche photodiode 10, thereby improving photo-collecting efficiency and photo-detection efficiency. The metal blocking layer may be formed in a manner of applying a second metal layer over a broad area of the substrate at the time of forming the second metal layer after forming metal contacts.

Although not illustrated in the drawings, in the laminate structure illustrated in FIG. 1A, an insulating passivation layer may be formed to seal the entire laminate structure except for a partial portion such that only at least parts of the metal electrodes 16a and 16b are exposed. The passivation layer may be formed of polycrystalline silicon, silicon nitride (Si$_3$N$_4$), indium-tin-oxide (ITO), a mixture of polycrystalline silicon and ITO, a mixture of polycrystalline silicon and silicon nitride (Si$_3$N$_4$), etc., but the material of the passivation layer may not be limited thereto. The metal blocking layer may be formed on the second electrode 16b exposed through the opening of the passivation layer and on the passivation layer. That is, the metal blocking layer is formed over the entire area of the substrate except for the light-receiving region of the avalanche photodiode 10 and disposed not to be in contact with the first electrode 16a, thereby blocking or masking the light from being incident onto the unintended regions.

The capacitance of the quenching diode 20 is required to be lower than that of the avalanche photodiode 10 to reduce a RC time constant and to increase a response speed. Preferably, the capacitance of the quenching diode 20 is much smaller than that of the avalanche photodiode 10 so as to be negligible. The capacitance of the quenching diode 20 decreases as a horizontal cross-sectional area thereof decreases. Accordingly, the quenching diode 20 may be formed to have a horizontal cross-sectional area that is only ¹⁄₁₀₀ times that of the avalanche photodiode 10, but the ratio of the sizes of the quenching diode 20 and the avalanche photodiode 10 may not be limited thereto. Although it is preferable that the size of the quenching diode 20 is small, there is a limit in reduction of the size of the quenching diode 20 because the maximum current-carrying capacity is reduced when the size of the quenching diode 20 is excessively reduced. Therefore, both of the size and the current-carrying capacity of the quenching diode must be considered at the time of designing the quenching diode. In the case where the quenching diode is used to detect a single photon and where it is necessary to obtain a high gain, since the current flowing through the quenching diode is not so large, it is possible to obtain a sufficient quenching effect even with only a small quenching diode 20.

Figure 3A:
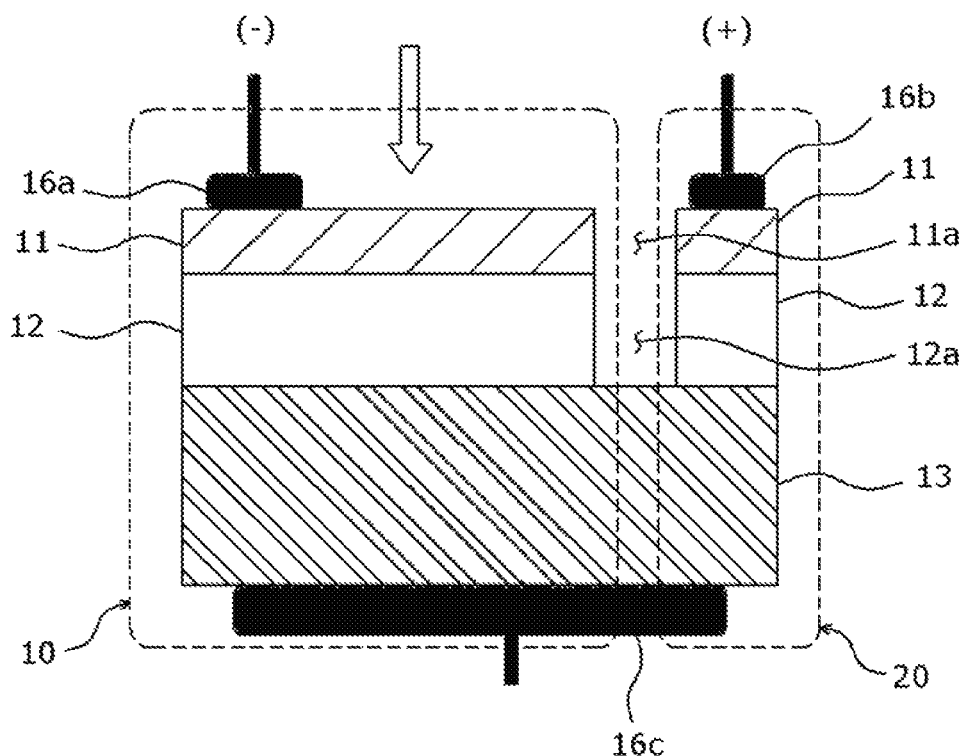
FIGS. 3A and 3B are respectively a cross-sectional view and a circuitry diagram illustrating a schematic construction of an avalanche photodiode and a quenching diode of a quenching circuit according to a second embodiment of the present invention.
Figure 3B:
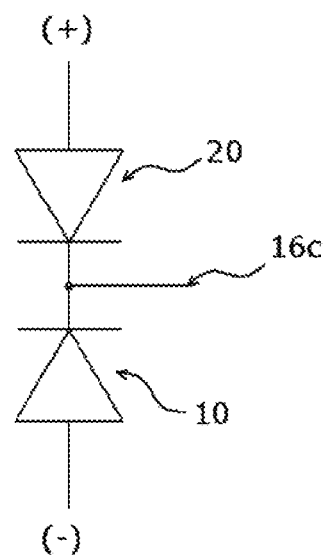

FIGS. 3A and 3B are a cross-sectional view and a circuitry diagram illustrating a schematic configuration of an avalanche photodiode and a quenching diode of a quenching circuit according to a second embodiment of the present invention.

Hereinbelow, referring to FIGS. 3A and 3B, the configuration of the quenching circuit according to the second embodiment of the present invention will be described. For convenience of description, among components of the quenching circuit according to the second embodiment, a description about the same components as in the first embodiment will be omitted and mainly different points of the second embodiment from the first embodiment will be described below.

As illustrated in FIG. 3A, the quenching circuit according to the second embodiment includes a first n-type semiconductor layer 13, a first i-type semiconductor layer 12 provided on an upper surface of the first n-type semiconductor layer 13 and provided with a second hole 12a through which a portion of the first n-type semiconductor layer 13 is exposed, a first p-type semiconductor layer 11 provided on the upper surface of the first i-type semiconductor layer 12 and provided with a first hole 11a perpendicularly extending from the second hole 12a, and a pair of metal electrodes 16a and 16b provided on the first p-type semiconductor 11 divided into a first region and a second region by the first hole 11a. The metal electrodes 16a and 16b are respectively called a first electrode 16a and a second electrode 16b. The first electrode 16a is provided on the upper surface of the first region of the first p-type semiconductor layer 11 and the second electrode 16b is provided on the upper surface of the second region of the p-type semiconductor layer 11.

The second hole 12a and the first hole 11a are formed by etching a predetermined portion of the first i-type semiconductor layer 12 and a predetermine portion of the first p-type semiconductor layer 11 in a state in which the first n-type semiconductor layer 13, the first i-type semiconductor layer 12, and the first p-type semiconductor layer 11 are formed, so that a portion of the first p-type semiconductor layer 13 is exposed. The first i-type semiconductor layer 12 is divided into a first region and a second region by the second hole 12a serving as a boundary between the first region and the second region and the first p-type semiconductor layer 11 is divided into a first region and a second region by the first hole 11a serving as a boundary between the first region and the second region. In FIG. 3A, the first region and the second region are respectively illustrated in the left side and the right side of the figure.

In this case, the avalanche photodiode 10 is a PIN diode composed of the first region of the first p-type semiconductor layer 11 divided by the first hole 11a, the first region of the first i-type semiconductor layer 12 divided by the second hole 12a, and the first n-type semiconductor layer 13. Here, the upper surface of the first region of the first p-type semiconductor layer 11, within which the first electrode 16a is disposed, is defined as the light-receiving region.

In this case, the quenching diode 20 is a PIN diode composed of the second region of the first p-type semiconductor layer 11 divided by the first hole 11a, the second region of the first i-type semiconductor layer 12 divided by the second hole 12a, and the first n-type semiconductor layer.

The third electrode 16c is a terminal for detecting a voltage while the quenching diode 20 operates to quench the breakdown when a photocurrent occurs in the avalanche photodiode 10. A voltage between the cathode of the avalanche photodiode 10 and the cathode of the quenching diode 20 is output through the third electrode 16c.

As illustrated in FIGS. 3A and 3B, when a lower voltage (−) is applied to the first electrode 16a and a higher voltage (+) is applied to the second electrode 16b, the avalanche photodiode 10 composed of the first region of the first p-type semiconductor layer 11, the first region of the first i-type semiconductor layer 12, and the first n-type semiconductor layer 13 is reverse-based, and the quenching diode 20 composed of the second region of the first p-type semiconductor layer 11, the second region of the first i-type semiconductor layer 12, and the first n-type semiconductor layer 13 is forward-based.

As described above, as in the first embodiment of the present invention, the quenching circuit according to the second embodiment operates such that when a photocurrent occurs in the avalanche photodiode 10, a current corresponding to the photocurrent also flows into the quenching diode that is in a state of being forward-biased. Therefore, the quenching diode 20 is turned on at a voltage equal to or higher than a threshold voltage thereof. As a result, a quenching voltage corresponding to the forward bias turn-on voltage of the quenching diode 20 is generated, so that the avalanche photodiode 10 recovers from a state of the Geiger mode to a state of a mode in which a reverse bias voltage lower than the avalanche breakdown voltage is applied.

Figure 10A:
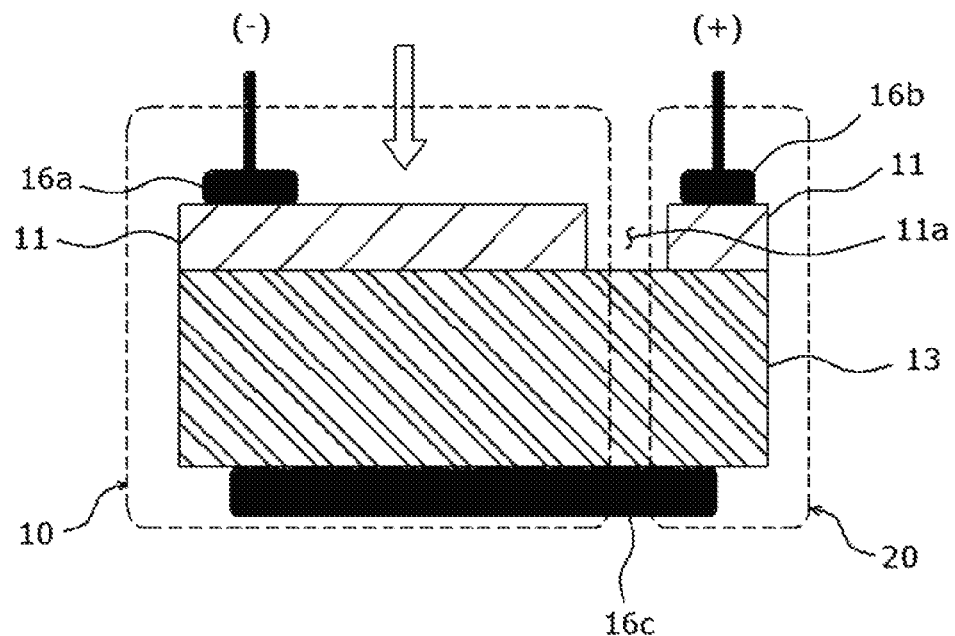
FIGS. 10A and 10B are respectively a cross-sectional view and a circuitry diagram illustrating a schematic construction of an avalanche photodiode and a quenching diode of a quenching circuit according to a modification of the second embodiment of the present invention.
Figure 10B:
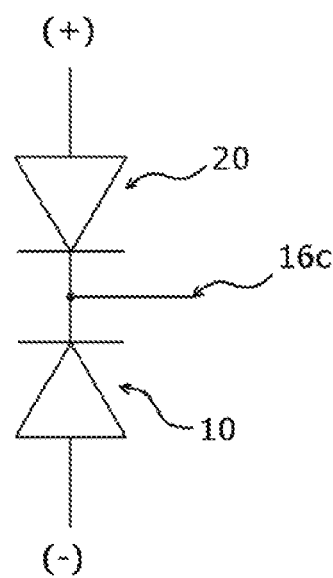

In the case where a quenching circuit is designed to operate with a small quenching voltage, the avalanche photodiode 10 of FIG. 3A and the quenching diode 20 of FIG. 3A included in the quenching circuit may be implemented as respective PN diodes as illustrated in FIG. 10.

That is, a first p-type semiconductor layer 11 is provided on the upper surface of a first n-type semiconductor layer 13, and the first p-type semiconductor layer 11 is provided with a first hole 11a such that a portion of the upper surface of the first n-type semiconductor layer 13 is exposed through the first hole 11a. In this case, the avalanche photodiode 10 has a PN diode structure composed of a first region of the first p-type semiconductor layer 11, disposed at a first side of the first hole 11a, and of the first n-type semiconductor layer 13. Similarly, the quenching diode 20 has a PN diode structure composed of a second region of the first p-type semiconductor layer 11, disposed at a second side (opposite to the first side) of the first hole 11a, and of the first n-type semiconductor layer 13.

Similarly to the first embodiment of the present invention, in the quenching circuit according to the second embodiment, the first n-type semiconductor layer 13, the first i-type semiconductor layer 12, the first p-type semiconductor layer 11 may be formed through epitaxial growth or ion implantation. The first n-type semiconductor layer 13, the first i-type semiconductor layer 12, the first p-type semiconductor layer 11 may be SiC-based semiconductor layers or GaN-based semiconductor layers. However, the material may not be limited thereto and various materials including Si-based materials may be applied thereto.

Figure 4:
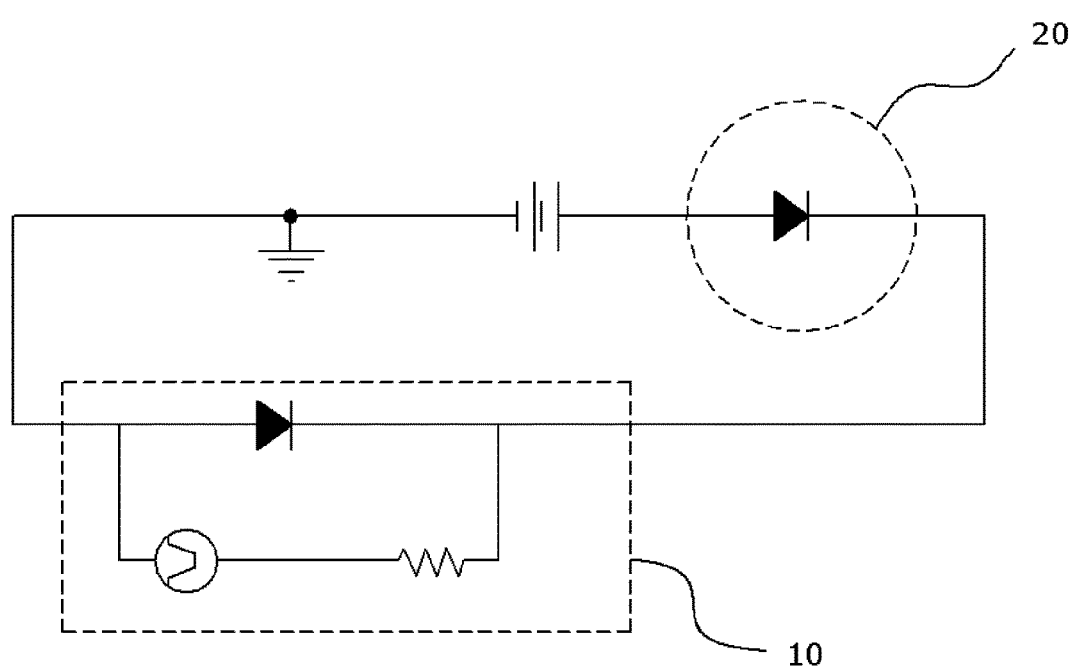
FIG. 4 is a circuitry diagram illustrating an equivalent circuit of a quenching circuit used in the embodiments of the present invention.

FIG. 4 is a circuitry diagram equivalent to a quenching circuit according to one embodiment of the present invention. The quenching circuit of FIG. 4 is designed by replacing a quenching resistor of a conventional quenching circuit with a quenching diode. FIGS. 5A to 7B illustrate comparison results of quenching performances of the quenching circuit of FIG. 4 and a conventional quenching circuit having a quenching resistor having a resistance value of 5 MΩ, in which the circuit of FIG. 4 is manufactured by applying parameter values of Table 1 and the conventional quenching circuit, and the circuit of FIG. 4 have the same APD characteristics.

TABLE 1

| | Diode model parameters | Unit | APD | Quenching diode |
|---|---|---|---|---|
| Is | Saturation Current | A | 1.00E−06 | 1.00E−06 |
| N | Emission Coefficient | | 25 | 25 |
| RS | Parsitic resistance (series resistance) | Ω | 1.98E−02 | 1.98E−02 |
| IKF | High-Injection Knee current | A | 1.89E−02 | 1.89E−02 |
| CJO | Zero-bias Junction capacitance | F | 1.81E−14 | 1.81E−16 |
| M | Grading Coefficient | | 2.28E−01 | 2.28E−01 |
| VJ | Junction potential | V | 3.18E+00 | 3.18E+00 |
| ISR | Recombination current | | 1.00E−20 | 1.00E−20 |
| NR | Emission Coefficient for ISR | | 6.00E+00 | 6.00E+00 |
| BV | Reverse Breakdown Voltage | V | 1.50E+02 | 1.50E+02 |
| IBV | Current at BV | A | 1.00E−06 | 1.00E−06 |
| FC | forward-bias depletion capacitance coefficient | | 5.00E−01 | 5.00E−01 |
| TT | Transient Time | s | 3.50E−12 | 3.50E−09 |
| XTI | Is temperature exponent | | 3.00E+00 | 3.00E+00 |
| EG | Bandgap Energy | eV | 3.25E+00 | 3.25E+00 |

Figure 5A:
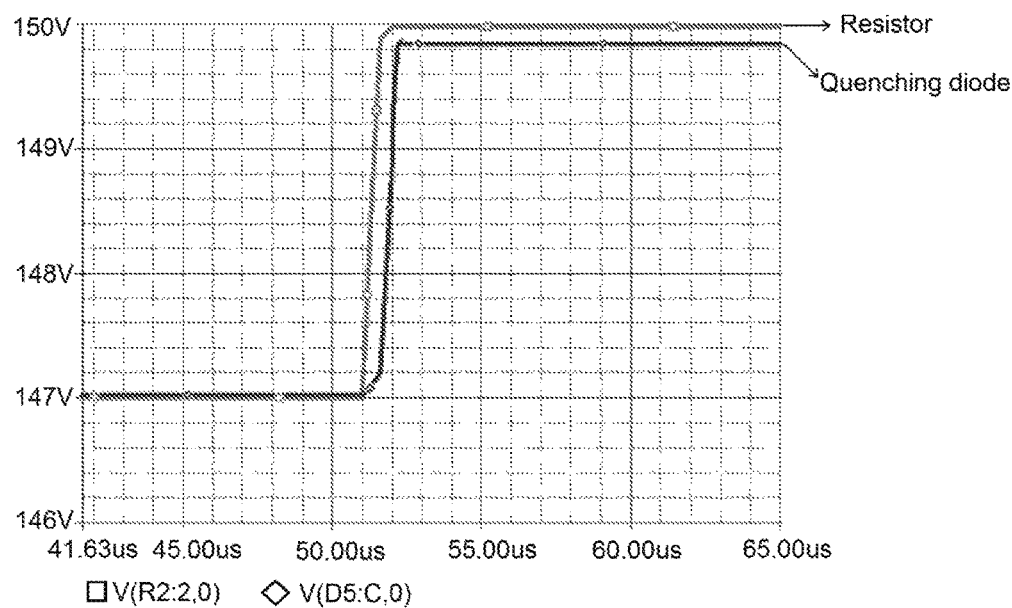
FIGS. 5A and 5B are graphical representations illustrating voltage rising times and voltage falling times in the results of simulation for comparing characteristics of the quenching diode of FIG. 4 and a conventional quenching resistor.
Figure 5B:
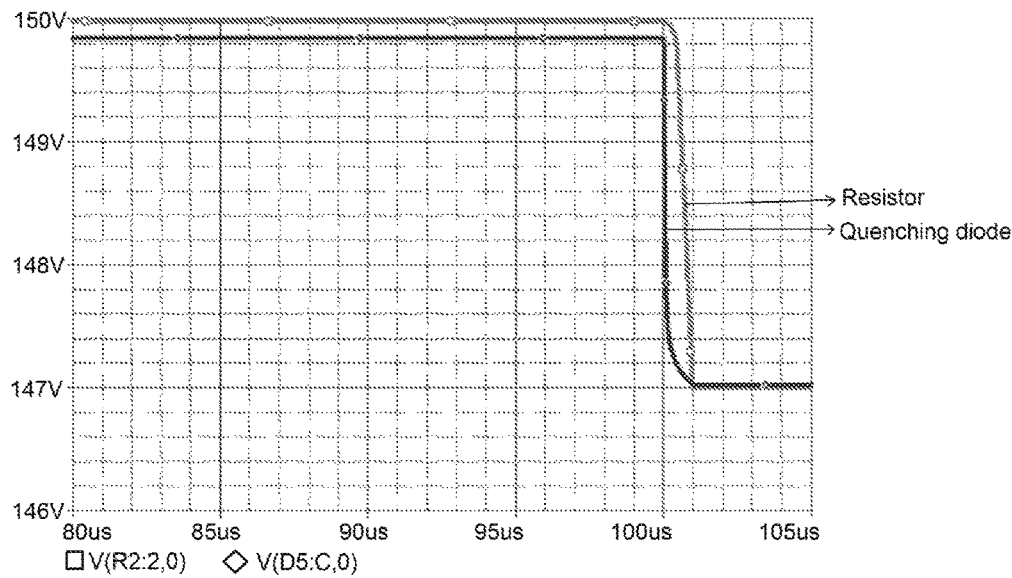

FIGS. 5A and 5B are simulation results illustrating voltage rising times and voltage falling times of the quenching circuit of FIG. 4 using a quenching diode and the conventional quenching circuit using a quenching resistor. As illustrated in FIG. 5A, the rising time Tr is 0.811 μs or shorter when a quenching resistor is used but the rising time Tr is 0.496 μs or shorter when the quenching diode 20 is used as in the embodiment of the present invention. As illustrated in FIG. 5B, the falling time Tf is 0.811 μs when the quenching resistor is used and the falling time Tf is 0.311 μs or shorter when the quenching diode 20 is used. As knowing from the simulation results, when the quenching diode 20 is used, voltage rising and falling delays are reduced in comparison with the case where the quenching resistor is used.

Figure 6A:
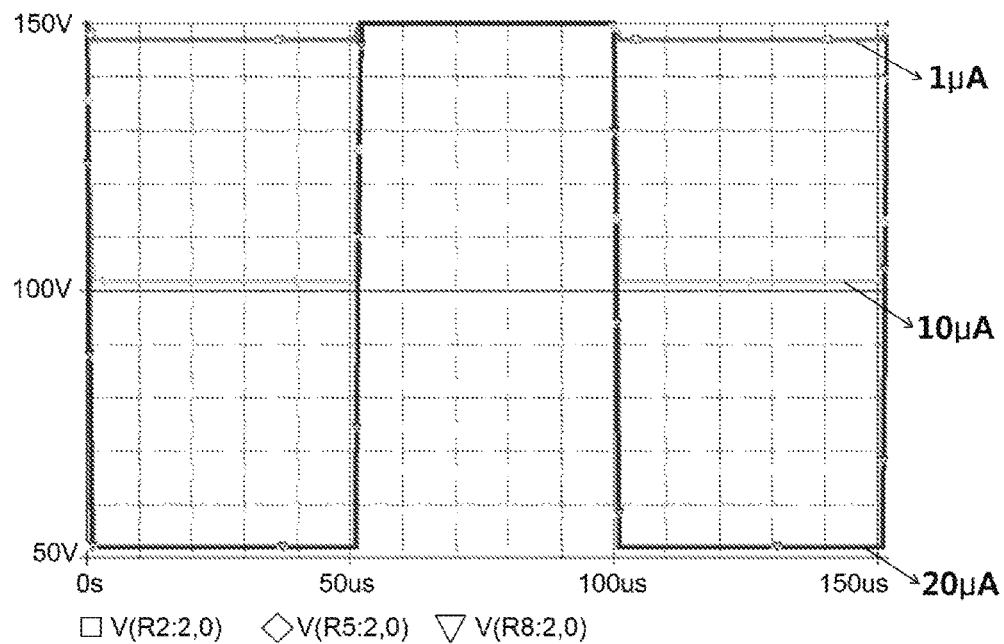
FIGS. 6A and 6B are graphical representations illustrating voltage rising and voltage falling according to a change in current, in the results of simulation for comparing characteristics of the quenching diode of FIG. 4 and a conventional quenching resistor.
Figure 6B:
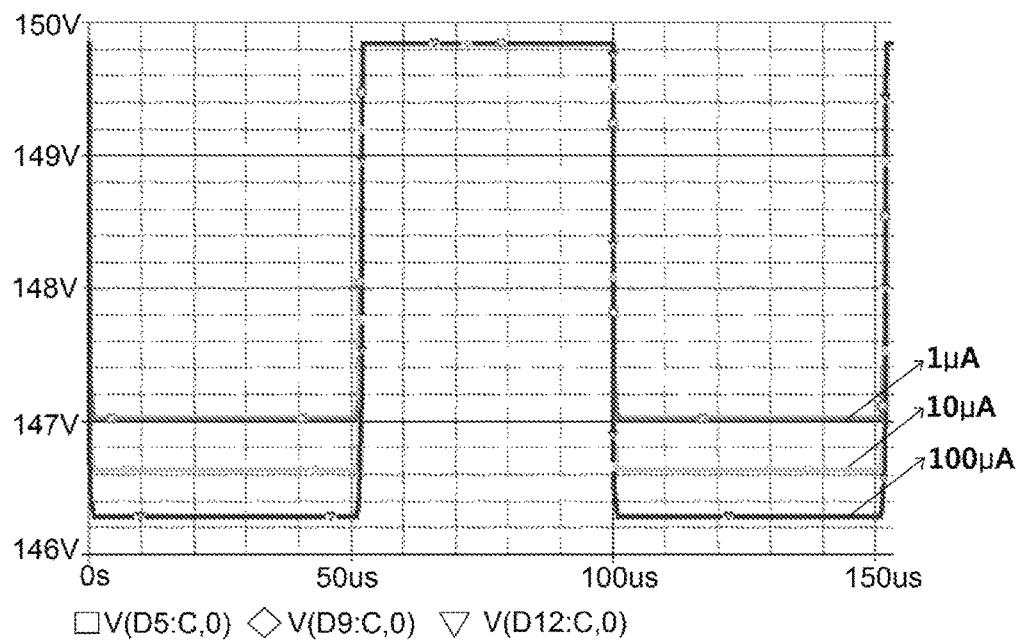

FIGS. 6A and 6B illustrate simulation results illustrating voltage changes according to current changes when the quenching circuit using the quenching diode of FIG. 4 and a conventional quenching circuit using a quenching resistor are used. As illustrated in FIG. 6A, when the quenching resistor is used, the quenching voltage changes within a range of 50 V to 150V while a current level changes from 1 μA to 10 μA and to 20 μA. That is, the voltage level greatly changes according to the current level. Therefore, it is found that it is difficult to obtain a stable quenching effect by using a quenching resistor. Meanwhile, when the quenching diode 20 is used, as illustrated in FIG. 6B, the quenching voltage changes from 146V to 147V while the current level changes from 1 μA to 10 μA and to 100 μA. That is, only a negligible voltage change occurs while the current level greatly changes. Therefore, it is possible to obtain a stable quenching effect regardless of the current level functions.

Figure 7:
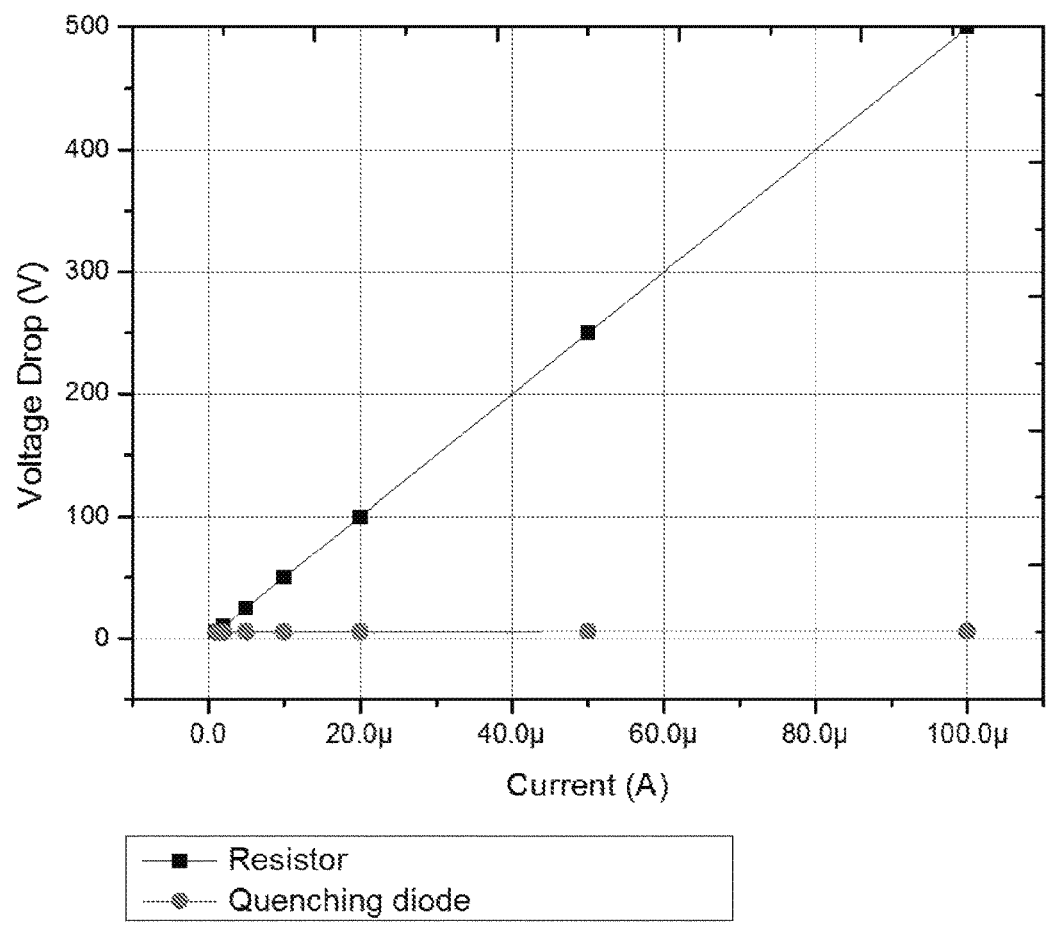
FIG. 7 is a graphical representation illustrating a simulation result for evaluating a voltage drop across the quenching diode of FIG. 4 and a voltage drop across a conventional quenching resistor.

FIG. 7 illustrates a simulation result of a voltage drop test where the voltage level drops from 152 V in the case of using the quenching diode of FIG. 4 and the case of using the conventional quenching resistor. As illustrated in FIG. 7, when the quenching resistor is used, the current level changes from 0 to 100.0 μA, the voltage drop linearly increases with an increasing current level. That is, since a voltage level change according to a current level change is large, it is difficult to obtain a stable quenching effect. Meanwhile, with the use of the quenching diode 20, when the current level changes from 0 to 100.0 μA, the voltage drop occurs only by 3 V to 3.7 V. That is, the voltage level change is small in comparison with the current level change. Therefore, it is possible to obtain a stable quenching effect regardless of the current level.

Although the present invention has been described with reference to exemplary embodiments, the embodiments are presented to describe the technical spirit of the present invention only for illustrative purposes and those skilled in the art will appreciate that various modifications and changes are possible, without departing from the scope and spirit of the present invention. Therefore, it should be understood that the protection scope of the present invention is defined by the accompanying claims rather than the description which is presented above. Moreover, the present invention is intended to cover not only the exemplary embodiments but also various alternatives, modifications, equivalents and other embodiments that may be included within the spirit and scope of the embodiments as defined by the appended claims.

The invention claimed is:

1. A quenching circuit including an avalanche photodiode and a quenching diode applying a bias voltage to one terminal of the avalanche photodiode, the quenching circuit comprising:
    a first p-type semiconductor layer;
    a first i-type semiconductor layer provided on an upper surface of the first p-type semiconductor layer;
    a first n-type semiconductor layer provided on an upper surface of the first i-type semiconductor layer;
    a second p-type semiconductor layer provided on a portion of the upper surface of the first n-type semiconductor layer; and
    a pair of metal electrodes respectively serving as a first electrode provided under a lower surface of the first p-type semiconductor layer and a second electrode provided on an upper surface of the second p-type semiconductor layer, wherein the avalanche photodiode includes the first p-type semiconductor layer, the first i-type semiconductor layer, and the first n-type semiconductor layer, and has a light-receiving region defined as a portion of the upper surface of the first n-type semiconductor layer, the portion not being covered by the second p-type semiconductor layer, and wherein the quenching diode includes the second p-type semiconductor layer and the first n-type semiconductor layer.

2. The quenching circuit according to claim 1, further comprising a second i-type semiconductor layer provided between the first n-type semiconductor layer and the second p-type semiconductor layer provided on the upper surface of the first n-type semiconductor layer wherein the second i-type semiconductor layer is provided to cover a portion of the upper surface of the first n-type semiconductor layer, wherein the light-receiving region of the avalanche photodiode is defined as a portion of the upper surface of the first n-type semiconductor layer, the portion not being covered by the second i-type semiconductor layer, and wherein the quenching diode is a PIN diode comprising the second p-type semiconductor layer, the second i-type semiconductor layer, and the first n-type semiconductor layer.

3. The quenching circuit according to claim 2, wherein each of the first p-type semiconductor layer, the first i-type semiconductor layer, the first n-type semiconductor layer, the second p-type semiconductor layer, and the second i-type semiconductor layer is an SiC-based semiconductor layer.

4. The quenching circuit according to claim 2, wherein each of the first p-type semiconductor layer, the first i-type semiconductor layer, the first n-type semiconductor layer, the second p-type semiconductor layer, and the second i-type semiconductor layer is a GaN-based semiconductor layer.

5. A quenching circuit including an avalanche photodiode and a quenching diode applying a bias voltage to one terminal of the avalanche photodiode, the quenching circuit comprising:

a first p-type semiconductor layer;
a first i-type semiconductor layer provided on an upper surface of the first p-type semiconductor layer;
a first n-type semiconductor layer provided on an upper surface of the first i-type semiconductor layer;
a second n$^-$-type semiconductor layer provided on a portion of the first n-type semiconductor layer;
a Schottky metal layer provided on an upper surface of the second n$^-$-type semiconductor layer; and
a pair of metal electrode respectively serving as a first electrode provided under a lower surface of the first p-type semiconductor layer and a second electrode provided on an upper surface of the Schottky metal layer, wherein the avalanche photodiode is a PIN diode comprising the first p-type semiconductor layer, the first i-type semiconductor layer, and the first n-type semiconductor layer, and having a light-receiving region defined as a portion of the upper surface of the first n-type semiconductor layer, the portion being uncovered by the second n$^-$-type semiconductor layer, and wherein the quenching diode is a Schottky diode comprising the Schottky metal layer, the second n$^-$-type semiconductor layer, and the first n-type semiconductor layer.

6. The quenching circuit according to claim 5, wherein each of the first p-type semiconductor layer, the first i-type semiconductor layer, the first n-type semiconductor layer, and the second n$^-$-type semiconductor layer is an SiC-based semiconductor layer.

7. The quenching circuit according to claim 5, wherein each of the first p-type semiconductor layer, the first i-type semiconductor layer, the first n-type semiconductor layer, and the second n$^-$-type semiconductor layer is a GaN-based semiconductor layer.

8. The quenching circuit according to claim 5, wherein the Schottky metal layer is made of any one of nickel (Ni), titanium (Ti), aluminum (Al), and tungsten (W).

9. A quenching circuit including an avalanche photodiode and a quenching diode applying a bias voltage to one terminal of the avalanche photodiode, the quenching circuit comprising:

a first n-type semiconductor layer;
a first p-type semiconductor layer provided on an upper surface of the first n-type semiconductor layer and provided with a first hole through which a portion of the first n-type semiconductor layer is exposed; and
a pair of metal layers respectively serving as a first electrode provided on an upper surface of a first region of the first p-type semiconductor layer that is divided into the first region and a second region by the first hole serving as a boundary between the first region and the second region, and a second electrode provided on an upper surface of the second region of the first p-type semiconductor layer, wherein the avalanche photodiode includes the first region of the first p-type semiconductor layer and the first n-type semiconductor layer and has a light-receiving region defined as the upper surface of the first region of the first p-type semiconductor layer, and wherein the quenching diode includes the second region of the first p-type semiconductor layer and the first n-type semiconductor layer.

10. The quenching circuit according to claim 9, further comprising a first i-type semiconductor layer provided between the first n-type semiconductor layer and the first p-type semiconductor layer, in which the first i-type semiconductor layer is provided with a second hole perpendicularly extending from the first hole formed in the first p-type semiconductor layer, wherein the avalanche photodiode is a PIN diode comprising the first region of the first p-type semiconductor layer, a first region of the first i-type semiconductor layer that is divided into the first region and a second region by the second hole serving as a boundary between the first region and the second region, and the first n-type semiconductor layer, and the quenching diode is a PIN diode comprising the second region of the first p-type semiconductor layer, the second region of the first i-type semiconductor layer, and the first n-type semiconductor layer.

11. The quenching circuit according to claim 10, wherein each of the first n-type semiconductor layer, the first i-type semiconductor layer, and the first p-type semiconductor layer is an SiC-based semiconductor layer.

12. The quenching circuit according to claim 10, wherein each of the first n-type semiconductor layer, the first i-type semiconductor layer, and the first p-type semiconductor layer is a GaN-based semiconductor layer.

\* \* \* \* \*